(12) United States Patent
Son

(10) Patent No.: US 9,159,709 B2
(45) Date of Patent: Oct. 13, 2015

(54) SEMICONDUCTOR CHIP AND STACKED SEMICONDUCTOR PACKAGE HAVING THE SAME

(71) Applicant: SK hynix Inc., Icheon-si Gyeonggi-do (KR)

(72) Inventor: Ho Young Son, Cheongwon-gun Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/516,672

(22) Filed: Oct. 17, 2014

(65) Prior Publication Data

US 2015/0091139 A1  Apr. 2, 2015

Related U.S. Application Data

(62) Division of application No. 13/566,118, filed on Aug. 3, 2012, now abandoned.

(30) Foreign Application Priority Data

Dec. 22, 2011 (KR) ........................ 10-2011-0140033

(51) Int. Cl.
*H01L 23/48* (2006.01)
*H01L 23/58* (2006.01)
(Continued)

(52) U.S. Cl.
CPC ............ *H01L 25/105* (2013.01); *H01L 23/481* (2013.01); *H01L 25/03* (2013.01); *H01L 25/0657* (2013.01); *H01L 21/7682* (2013.01); *H01L 23/3128* (2013.01); *H01L 24/05* (2013.01); *H01L 24/06* (2013.01); *H01L 24/13* (2013.01); *H01L 24/14* (2013.01); *H01L 24/16* (2013.01); *H01L 24/32* (2013.01); *H01L 24/48* (2013.01); *H01L 24/73* (2013.01); *H01L 2224/02372* (2013.01); *H01L 2224/0401* (2013.01); *H01L 2224/05009* (2013.01); *H01L 2224/05548* (2013.01); *H01L 2224/05567* (2013.01); *H01L 2224/06181* (2013.01); *H01L 2224/131* (2013.01); *H01L 2224/13022* (2013.01); *H01L 2224/14181* (2013.01); *H01L 2224/16145* (2013.01); *H01L 2224/16225* (2013.01); *H01L 2224/16235* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2225/06513* (2013.01); *H01L 2225/06517* (2013.01); *H01L 2225/06527* (2013.01); *H01L 2225/06541* (2013.01); *H01L 2225/107* (2013.01); *H01L 2225/1023* (2013.01); *H01L 2225/1041* (2013.01); *H01L 2924/00014* (2013.01); *H01L 2924/15311* (2013.01)

(58) Field of Classification Search
USPC ......... 257/774, 522, 419, 773, 758, 737, 499, 257/762, 764, 506; 438/303, 591, 618, 421, 438/584, 637, 783, 763
See application file for complete search history.

(56) References Cited

U.S. PATENT DOCUMENTS

2004/0097065 A1* 5/2004 Lur et al. ....................... 438/619
2008/0237806 A1* 10/2008 Uchiyama ..................... 257/621

*Primary Examiner* — Selim Ahmed
*Assistant Examiner* — Moin Rahman
(74) *Attorney, Agent, or Firm* — William Park & Associates Ltd.

(57) ABSTRACT

A semiconductor chip includes a substrate, through-electrodes passing through the substrate, and a dielectric layer formed between the substrate and the through-electrodes and having a dielectric constant decreasing structure.

9 Claims, 9 Drawing Sheets

(51) Int. Cl.
H01L 25/10 (2006.01)
H01L 25/03 (2006.01)
H01L 25/065 (2006.01)
*H01L 21/768* (2006.01)
*H01L 23/31* (2006.01)
*H01L 23/00* (2006.01)

SEMICONDUCTOR CHIP AND STACKED SEMICONDUCTOR PACKAGE HAVING THE SAME

CROSS-REFERENCE TO RELATED APPLICATIONS

The present application claims priority under 35 U.S.C. 119(a) to Korean patent application number 10-2011-140033 filed in the Korean intellectual property office on Dec. 22, 2011, which is incorporated herein by reference in its entirety.

BACKGROUND OF THE INVENTION

1. Field of the Invention

The present invention relates to a semiconductor device, and more particularly, to a semiconductor chip and a stacked semiconductor package having the same.

2. Description of the Related Art

Packaging technologies for semiconductor devices have continuously been developed to meet the demand toward miniaturization and high capacity. Recently, various techniques for stacked semiconductor packages have been disclosed in the art to improve miniaturization, capacity and mounting efficiency.

The term "stack", which is referred to in the semiconductor industry, means to vertically pile at least two semiconductor chips or packages. Through stacking semiconductor chips or packages, in the case of a memory device, it is possible to realize a product having a memory capacity greater than that obtainable through semiconductor integration processes, and stacking can also improve mounting area utilization efficiency.

As an example of a stacked semiconductor package, a structure using through-electrodes has been suggested. A stacked semiconductor package using through-electrodes provides advantages in that, since electrical connections are formed through through-electrodes, the operation speed of a semiconductor device can be increased and miniaturization is possible.

However, due to parasitic capacitance between a semiconductor chip and a through-electrode, a signal transfer speed decreases, a difference in operation speed between semiconductor chips comprising a stack increases, and power noise increases causing electrical characteristics to deteriorate.

BRIEF SUMMARY OF THE INVENTION

An embodiment of the present invention is directed to a semiconductor chip suitable for reducing parasitic capacitance between a semiconductor chip and a through-electrode.

Also, an embodiment of the present invention is directed to a stacked semiconductor package using the semiconductor chip.

In one embodiment of the present invention, a semiconductor chip includes: a substrate; through-electrodes passing through the substrate; and a dielectric layer formed between the substrate and the through-electrodes and having a dielectric constant decreasing structure.

The dielectric layer with the dielectric constant decreasing structure may include a hollow type dielectric layer which has an air gap defined in a center portion thereof. Material comprising the hollow type dielectric layer may include any one selected from the group consisting of a silicon oxide layer, a silicon nitride layer, a silicon oxynitride layer, polyimide, BCB (benzocyclobutene) and parylene.

The dielectric layer with the dielectric constant decreasing structure may include a porous dielectric layer which has a plurality of air gaps therein. Material comprising the porous dielectric layer may include any one selected from the group consisting of a silicon oxide layer, a silicon nitride layer, a silicon oxynitride layer, HSSQ (hydro silsesquioxane) and MSSQ (methyl silsesquioxane).

The dielectric layer with the dielectric constant decreasing structure may include a double-layered structure of a hollow type dielectric layer which has an air gap defined in the center portion thereof and an air gap-free dielectric layer which has no air gap therein. Material comprising the hollow type dielectric layer and the air gap-free dielectric layer may include any one selected from the group consisting of a silicon oxide layer, a silicon nitride layer, a silicon oxynitride layer, polyimide, BCB and parylene.

The dielectric layer with the dielectric constant decreasing structure may include a double-layered structure of a porous dielectric layer which has a plurality of air gaps therein and an air gap-free dielectric layer which has no air gap therein. Material comprising the porous dielectric layer may include any one selected from the group consisting of a silicon oxide layer, a silicon nitride layer, a silicon oxynitride layer, HSSQ and MSSQ, and material comprising the air gap-free dielectric layer may include any one selected from the group consisting of a silicon oxide layer, a silicon nitride layer, a silicon oxynitride layer, polyimide, BCB and parylene.

The dielectric layer with the dielectric constant decreasing structure may include a double-layered structure of a hollow type dielectric layer which has an air gap defined in the center portion thereof and a porous dielectric layer which has a plurality of air gaps therein. Material comprising the hollow type dielectric layer may include any one selected from the group consisting of a silicon oxide layer, a silicon nitride layer, a silicon oxynitride layer, polyimide, BCB and parylene, and material comprising the porous dielectric layer may include any one selected from the group consisting of a silicon oxide layer, a silicon nitride layer, a silicon oxynitride layer, HSSQ and MSSQ.

In another embodiment of the present invention, a stacked semiconductor package includes: a plurality of semiconductor chips each including a substrate, through-electrodes passing through the substrate and a dielectric layer formed between the substrate and the through-electrodes and having a dielectric constant decreasing structure, and stacked such that through-electrodes of the plurality of semiconductor chips are connected with one another.

The stacked semiconductor package may further include: a first dielectric layer formed under a lowermost semiconductor chip among the plurality of stacked semiconductor chips in such a way as to leave the through-electrodes of the lowermost semiconductor chip exposed; redistribution lines formed under the first dielectric layer and electrically connected with the exposed through-electrodes of the lowermost semiconductor chip; and a second dielectric layer formed under the first dielectric layer including the redistribution lines in such a way as to leave portions of the redistribution lines exposed. Besides, the stacked semiconductor package may further include external connection terminals mounted to the portions of the redistribution lines which are exposed through the second dielectric layer.

The stacked semiconductor package may further include a structural body supporting the semiconductor chips and having connection electrodes which are electrically connected with the through-electrodes of the lowermost semiconductor chip among the plurality of stacked semiconductor chips. The structural body may include any one of a printed circuit board, an interposer and a semiconductor package.

The dielectric layer with the dielectric constant decreasing structure of the lowermost semiconductor chip may have a highest dielectric constant among the semiconductor chips, dielectric constants of dielectric layers with the dielectric constant decreasing structure may gradually decrease toward an uppermost semiconductor chip, and the dielectric layer with the dielectric constant decreasing structure of the uppermost semiconductor chip may have a lowest dielectric constant.

The semiconductor chips may include a first semiconductor chip, a second semiconductor chip which is stacked under the first semiconductor chip, and a third semiconductor chip which is stacked under the second semiconductor chip; and the dielectric layer of the first semiconductor chip may include a double-layered structure of a porous dielectric layer which has a plurality of air gaps therein and an air gap-free dielectric layer which has no air gap therein, the dielectric layer of the second semiconductor chip may include a single-layered structure of a porous dielectric layer which has a plurality of air gaps therein, and the dielectric layer of the third semiconductor chip may include a single-layered structure of a hollow type dielectric layer which has an air gap defined in a center portion thereof.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
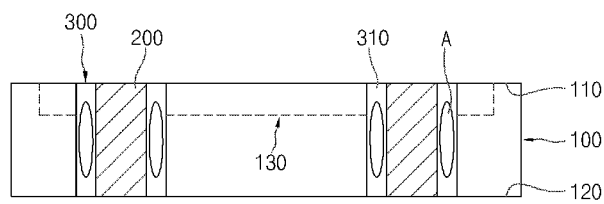
FIG. 1 is a cross-sectional view illustrating a semiconductor chip in accordance with a first embodiment of the present invention.

FIG. 1 is a cross-sectional view illustrating a semiconductor chip in accordance with a first embodiment of the present invention.

Referring to FIG. 1, a semiconductor chip 10A in accordance with a first embodiment of the present invention includes a substrate 100, through-electrodes 200, and a dielectric layer 300 with a dielectric constant decreasing structure.

The substrate 100 has a first surface 110, a second surface 120 and a circuit unit 130.

The first surface 110 faces away from the second surface 120, and the circuit unit 130 is formed on the first surface 110. The circuit unit 130 includes, for example, elements such as transistors, capacitors and resistors, to store and process data.

The through-electrodes 200 pass through the first surface 110 and the second surface 120 of the substrate 100. Each through-electrode 200 may have a circular sectional shape when viewed from the top. Each through-electrode 200 may also have an elliptical, quadrangular or pentagonal sectional shape. The through-electrodes 200 may be made of materials such as, copper or tungsten.

The dielectric layer 300 with a dielectric constant decreasing structure is formed between the substrate 100 and the through-electrodes 200. In the present embodiment, the dielectric layer 300 with a dielectric constant decreasing structure is formed as a hollow type dielectric layer 310 which has an air gap A defined in the center portion thereof.

The hollow type dielectric layer 310 may be made of materials including any one selected among silicon oxide, silicon nitride, silicon oxynitride layer, polyimide, BCB (benzocyclobutene), and parylene.

The hollow type dielectric layer 310 may be formed by defining a donut-shaped hole where the donut-shaped hole surrounds each through-electrode 200, and depositing a dielectric layer using a deposition method with poor step coverage property.

For example, a PECVD (plasma-enhanced chemical vapor deposition) method may be used to deposit the dielectric layer, clogging the entrances of the holes in the first surface 110 and the second surface 120 but the hole comprising the hollow type dielectric layer 330 is not completely filled, instead the air gap A remains in the hollow type dielectric layer 330 such that the donut shaped hole surrounds the through-electrode 200.

The dielectric constant of the air gap A is 1.0 and corresponds to about ¼ of the dielectric constant of the silicon oxide material which is 3.9. Accordingly, the dielectric constant of the hollow type dielectric layer 310 is lower than the dielectric constant of a solid silicon oxide layer that is 3.9, and the dielectric constant of the hollow type dielectric layer 310 is higher than the dielectric constant of the air gap A that is 1.0. As the air gap A fills a higher percentage (%) of space in the hollow type dielectric layer 310, the dielectric constant of the hollow type dielectric layer 310 is lowered.

Figure 2:
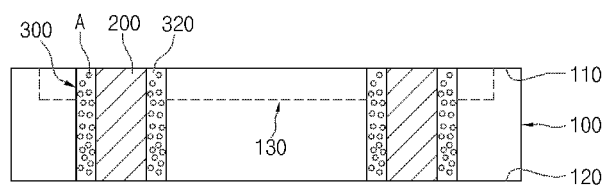
FIG. 2 is a cross-sectional view illustrating a semiconductor chip in accordance with a second embodiment of the present invention.

FIG. 2 is a cross-sectional view illustrating a semiconductor chip in accordance with a second embodiment of the present invention.

A semiconductor chip 10B in accordance with a second embodiment of the present invention has a construction in which the form of the dielectric layer 300 with a dielectric constant decreasing structure differs from the form of the dielectric layer 300 of the semiconductor chip 10A of the first embodiment described with reference to FIG. 1. Otherwise, the semiconductor chip in accordance with the second embodiment of the present invention has substantially the same construction as the semiconductor chip 10A in accordance with the first embodiment except for the dielectric layer 300 with a dielectric constant decreasing structure. Therefore, repeated descriptions of the same component parts will be omitted herein, and the same terms and the same reference numerals will be used to refer to the same component parts.

Referring to FIG. 2, in the present embodiment, a dielectric layer 300 with a dielectric constant decreasing structure is formed as a porous dielectric layer 320 which has a plurality of air gaps A therein.

The porous dielectric layer 320 may be made of materials including any one of silicon oxide, silicon nitride, silicon oxynitride, HSSQ (hydro silsesquioxane) and MSSQ (methyl silsesquioxane).

Figure 3:
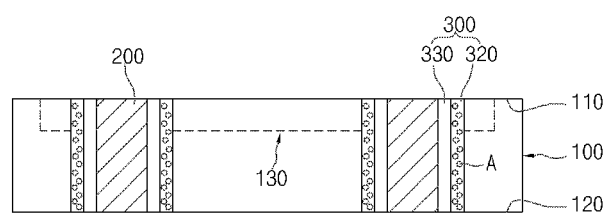
FIG. 3 is a cross-sectional view illustrating a semiconductor chip in accordance with a third embodiment of the present invention.

FIG. 3 is a cross-sectional view illustrating a semiconductor chip in accordance with a third embodiment of the present invention.

A semiconductor chip 10C in accordance with a third embodiment of the present invention has a construction in which the structure of the dielectric layer 300 with a dielectric constant decreasing structure differs from the form of the dielectric layer 300 of the semiconductor chip 10A of the first embodiment described above with reference to FIG. 1. Hence, the semiconductor chip in accordance with the third embodiment of the present invention has substantially the same construction as the semiconductor chip 10A in accordance with the first embodiment except for the dielectric layer 300 with a dielectric constant decreasing structure. Therefore, repeated descriptions for the same component parts will be omitted herein, and the same terms and the same reference numerals will be used to refer to the same component parts.

Referring to FIG. 3, in the present embodiment, a dielectric layer 300 with a dielectric constant decreasing structure has a double-layered structure of a porous dielectric layer 320 which has a plurality of air gaps A therein, and an air gap-free dielectric layer 330 which has no air gaps therein.

The porous dielectric layer 320 may be made of a material including any one of silicon oxide, silicon nitride layer, silicon oxynitride layer, HSSQ and MSSQ. The air gap-free dielectric layer 330 may be made of a material including any one selected from among silicon oxide, silicon nitride, silicon oxynitride, polyimide, BCB and parylene.

Figure 4:
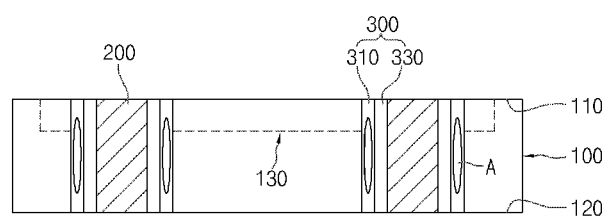
FIG. 4 is a cross-sectional view illustrating a semiconductor chip in accordance with a fourth embodiment of the present invention.

FIG. 4 is a cross-sectional view illustrating a semiconductor chip in accordance with a fourth embodiment of the present invention.

A semiconductor chip 10D in accordance with a fourth embodiment of the present invention has a construction in which the form of the dielectric layer 300 with a dielectric constant decreasing structure differs from the form of the dielectric layer 300 of the semiconductor chip 10A of the first embodiment described above with reference to FIG. 1. Hence, the semiconductor chip in accordance with the fourth embodiment of the present invention has substantially the same construction as the semiconductor chip 10A in accordance with the first embodiment except for the dielectric layer 300 with a dielectric constant decreasing structure. Therefore, repeated descriptions of the same component parts will be omitted herein, and the same terms and the same reference numerals will be used to refer to the same component parts.

Referring to FIG. 4, in the present embodiment, a dielectric layer 300 with a dielectric constant decreasing structure has a double-layered structure of a hollow type dielectric layer 310 which has an air gap A defined in the center portion thereof and an air gap-free dielectric layer 330 which has no air gap therein. The air gap A may form a donut-shaped hole that surrounds the through silicon via 200 and the air gap-free dielectric layer 330.

The hollow type dielectric layer 310 and the air gap-free dielectric layer 330 may be made from a material including any one selected from among silicon oxide, silicon nitride, silicon oxynitride, polyimide, BCB and parylene.

Figure 5:
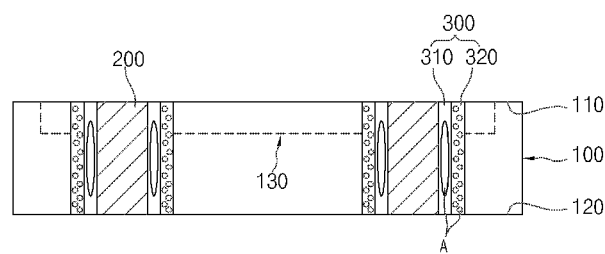
FIG. 5 is a cross-sectional view illustrating a semiconductor chip in accordance with a fifth embodiment of the present invention.

FIG. 5 is a cross-sectional view illustrating a semiconductor chip in accordance with a fifth embodiment of the present invention.

A semiconductor chip 10E in accordance with a fifth embodiment of the present invention has a construction in which the structure of the dielectric layer 300 with a dielectric constant decreasing structure differs from the semiconductor chip 10A of the first embodiment described above with reference to FIG. 1. Hence, the semiconductor chip in accordance with the fifth embodiment of the present invention has substantially the same construction as the semiconductor chip 10A of the first embodiment except for the dielectric layer 300 with a dielectric constant decreasing structure. Therefore, repeated descriptions for the same component parts will be omitted herein, and the same terms and the same reference numerals will be used to refer to the same component parts.

Referring to FIG. 5, in the present embodiment, a dielectric layer 300 with a dielectric constant decreasing structure has a double-layered structure of a hollow type dielectric layer 310 which has an air gap A defined in the center portion thereof and a porous dielectric layer 320 which has a plurality of air gaps A therein, which may be smaller than the air gaps A comprising the hollow type dielectric layer 310.

The hollow type dielectric layer 310 may be made from a material including any one selected from among silicon oxide layer, silicon nitride layer, silicon oxynitride layer, polyimide, BCB and parylene. The porous dielectric layer 320 may be made from a material including any one of silicon oxide, silicon nitride, silicon oxynitride layer, HSSQ and MSSQ.

Hereafter, stacked semiconductor packages comprising semiconductor chips described above will be described.

Figure 6:
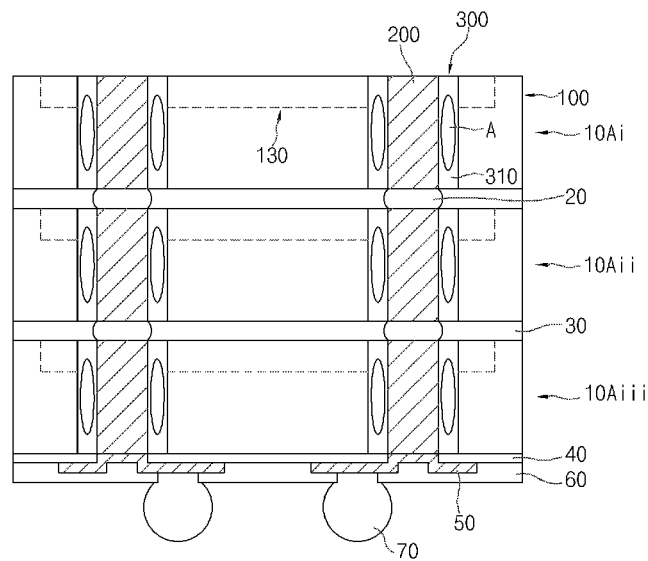
FIG. 6 is a cross-sectional view illustrating a stacked semiconductor package in accordance with a sixth embodiment of the present invention.

FIG. 6 is a cross-sectional view illustrating a stacked semiconductor package in accordance with a sixth embodiment of the present invention. In one example, the stacked semiconductor package may be comprised of semiconductor chips substantially similar to the semiconductor chip 10A depicted in FIG. 1.

Referring to FIG. 6, after preparing semiconductor chips 10Ai-iii including through-electrodes 200 and a dielectric layer 300 with a dielectric constant decreasing structure, through-electrodes 200 of second semiconductor chip 10Aii are connected to the through-electrodes 200 of a first semiconductor chip 10Ai by the medium of connection members 20. In this way, a plurality of semiconductor chips 10Ai-iii, for example, three semiconductor chips 10Ai-iii are stacked upon one another. Adhesive members 30 are formed between the stacked semiconductor chips 10Ai-iii to attach first and second semiconductor chips 10Ai and 10Aii to each other, and attach second and third semiconductor chips 10Aii and 10Aiii to each other. The connection members 20 may include solders, and the adhesive members 30 may include non-conductive pastes.

A first dielectric layer 40 is formed under the lower surface of the third semiconductor chip 10Aiii which is positioned lowermost among the stacked semiconductor chips 10Ai-iii, in such a way as to expose the through-electrodes 200 of the lowermost semiconductor chip 10Aiii, and redistribution lines 50, which are electrically connected with the through-electrodes 200 of the lowermost semiconductor chip 10Aiii, are formed under the first dielectric layer 40. A second dielectric layer 60 is formed under the first dielectric layer 40 including the redistribution lines 50 in such a way as to expose portions of the redistribution lines 50, and external connection terminals 70 are mounted to portions of the redistribution lines 50 which are exposed through the second dielectric layer 60.

Figure 7:
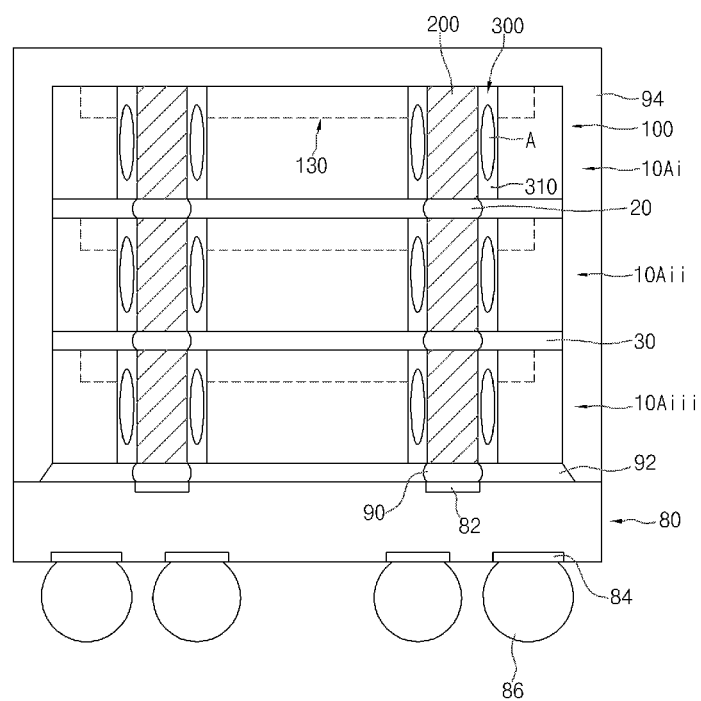
FIG. 7 is a cross-sectional view illustrating a stacked semiconductor package in accordance with a seventh embodiment of the present invention.

FIG. 7 is a cross-sectional view illustrating a stacked semiconductor package in accordance with a seventh embodiment of the present invention.

Referring to FIG. 7, after preparing semiconductor chips 10Ai-iii including through-electrodes 200 and a dielectric layer 300 with a dielectric constant decreasing structure, the through-electrodes 200 of a first semiconductor chip 10Ai and the through-electrodes 200 of a second semiconductor chip 10Aii are connected with each other by the medium of connection members 20. Similarly, the through-electrodes 200 of the second semiconductor chip 10Aii and the through-electrodes 200 of a third semiconductor chip 10Aiii are also connected with each other by the medium of connection members 20. In this way, a plurality of semiconductor chips 10Ai-iii, for example, three semiconductor chips 10Ai-iii are stacked upon one another. Adhesive members 30 are formed between the stacked semiconductor chips 10Ai and 10Aii, and adhesive members 30 are also formed between the stacked semiconductor chips 10Aii and 10Aiii. The connection members 20 may include solders, and the adhesive members 30 may include non-conductive pastes.

The stacked semiconductor chips 10Ai-iii are mounted to a structural body 80 in such a manner that the through-electrodes 200 of the third semiconductor chip 10Aiii positioned lowermost among the stacked semiconductor chips 10Ai-iii are connected with connection electrodes 82 of the structural body 80. In the present embodiment, the structural body 80 is constituted by a printed circuit board (PCB).

The through-electrodes 200 of the third semiconductor chip 10Aiii and the connection electrodes 82 of the structural body are electrically connected with each other by connection members 90. In order to improve the reliability of joints, an underfill member 92 is filled between the third chip 10Aiii and the structural body 80.

The upper surface of the structural body 80 including the stacked semiconductor chips 10A is sealed by a molding member 94. The reference numeral 84 designates ball lands, and the reference numeral 86 designates solder balls used as external connection terminals.

While it was explained in the seventh embodiment described above with reference to FIG. 7 that the structural body 80 is constituted by a printed circuit board (PCB), the structural body 80 may also be constituted by a semiconductor package or an interposer. Stacked semiconductor packages adopting a semiconductor package and an interposer will be described below with reference to FIGS. 8 and 9.

Figure 8:
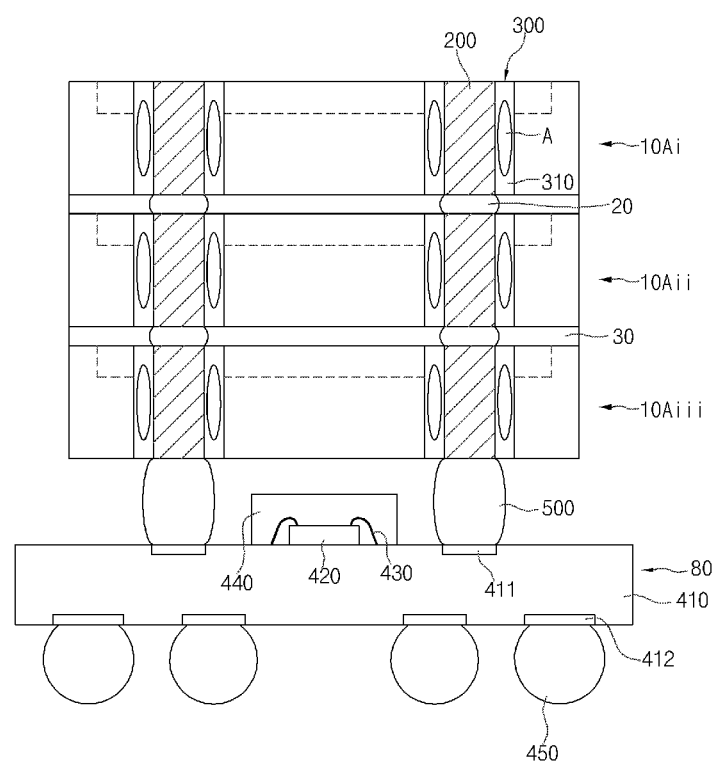
FIG. 8 is a cross-sectional view illustrating a stacked semiconductor package in accordance with an eighth embodiment of the present invention.

FIG. 8 is a cross-sectional view illustrating a stacked semiconductor package in accordance with an eighth embodiment of the present invention.

A stacked semiconductor package in accordance with an eighth embodiment of the present invention has a construction in which the printed circuit board serving as the structural body 80 shown in the seventh embodiment is replaced with a semiconductor package. Hence, the stacked semiconductor package in accordance with the eighth embodiment of the present invention has substantially the same construction as the stacked semiconductor package in accordance with the seventh embodiment except for the structural body 80. Thus, the same terms and the same reference numerals will be used to refer to the same component parts.

Referring to FIG. 8, after preparing semiconductor chips 10Ai-iii including through-electrodes 200 and a dielectric layer 300 with a dielectric constant decreasing structure, the through-electrodes 200 of a first semiconductor chip 10Ai and the through-electrodes 200 of a second semiconductor chip 10Aii are connected with each other by the medium of connection members 20, and the through-electrodes 200 of the second semiconductor chip 10Aii and the through-electrodes 200 of a third semiconductor chip 10Aiii are connected with each other by the medium of connection members 20. In this way, a plurality of semiconductor chips 10Ai-iii, for example, three semiconductor chips 10Ai-iii are stacked upon one another. Adhesive members 30 are formed between the stacked semiconductor chips 10Ai and 10Aii, and 10Aii and 10Aiii. The connection members 20 may include solders, and the adhesive members 30 may include non-conductive pastes.

The stacked semiconductor chips 10A are mounted to a structural body 80 in such a manner that the through-electrodes 200 of the third semiconductor chip 10Aiii, positioned lowermost among the stacked semiconductor chips 10i-iii, are connected with connection electrodes 411 of the structural body 80. In the present embodiment, the structural body 80 is constituted by a semiconductor package.

The semiconductor package includes a substrate 410 which has the connection electrodes 411 on the upper surface thereof and ball lands 412 on the lower surface thereof and a first semiconductor chip 420 which is mounted on the upper surface of the substrate 410 inside the connection electrodes 411. The first semiconductor chip 420 is electrically connected with the substrate 410 using wires 430 and is sealed by a molding member 440. The reference numeral 450 designates external connection terminals which are mounted to the ball lands 412 of the substrate 410.

The through-electrodes 200 of the third semiconductor chip 10Aiii and the connection electrodes 411 of the structural body 80 are connected with each other by the medium of connection members 500. In the present embodiment, the connection members 500 are formed as solder balls. The connection members 500 may also be formed as lead wires.

Figure 9:
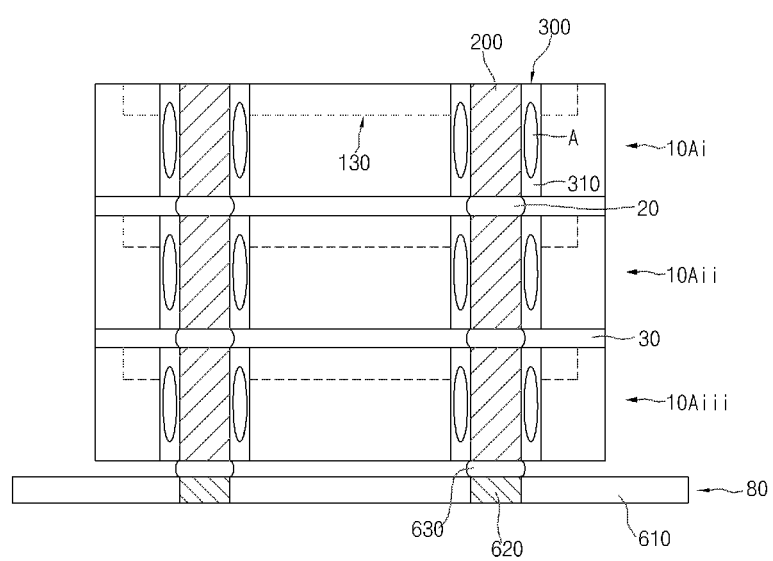
FIG. 9 is a cross-sectional view illustrating a stacked semiconductor package in accordance with a ninth embodiment of the present invention.

FIG. 9 is a cross-sectional view illustrating a stacked semiconductor package in accordance with a ninth embodiment of the present invention.

A stacked semiconductor package in accordance with a ninth embodiment of the present invention has a construction in which the printed circuit board serving as the structural body 80 of the seventh embodiment shown in FIG. 7 is replaced with an interposer. Hence, the stacked semiconductor package in accordance with the ninth embodiment of the present invention has substantially the same construction as the stacked semiconductor package in accordance with the seventh embodiment except for the structural body 80. Thus, the same terms and the same reference numerals will be used to refer to the same component parts.

Referring to FIG. 9, after preparing semiconductor chips 10Ai-iii including through-electrodes 200 and a dielectric layer 300 with a dielectric constant decreasing structure, the through-electrodes 200 of a first semiconductor chip 10Ai and the through-electrodes 200 of a second semiconductor chip 10Aii are connected with each other by the medium of connection members 20, and the through-electrodes 200 of the second semiconductor chip 10Aii and the through-electrodes 200 of a third semiconductor chip 10Aiii are also connected with each other by the medium of connection members 20. In this way, a plurality of semiconductor chips 10Ai-iii, for example, three semiconductor chips 10Ai-iii are stacked upon one another. Adhesive members 30 are formed between the stacked semiconductor chips 10A. The connection members 20 may include solders, and the adhesive members 30 may include non-conductive pastes.

The stacked semiconductor chips 10Ai-iii are mounted to a structural body 80 in such a manner that the through-electrodes 200 of the third semiconductor chip 10Aiii, positioned lowermost among the stacked semiconductor chips 10Ai-iii, are connected with connection electrodes 620 of the structural body 80. In the present embodiment, the structural body 80 is constituted by an interposer.

The interposer includes an interposer body 610 and the connection electrodes 620 which connect the upper surface and the lower surface of the interposer body 610 with each other.

The through-electrodes 200 of the third chip 10Aiii and the connection electrodes 620 of the structural body 80 are connected with each other by the medium of connection members 630.

While not shown in a drawing, after the stacked semiconductor chips 10Ai-iii are mounted to the interposer, the stacked semiconductor chips 10Ai-iii are mounted to another semiconductor structure, for example, a semiconductor package or a main board, by the medium of the interposer.

Although it was illustrated and explained in the embodiments described above with reference to FIGS. 6 to 9 that the stacked semiconductor package is constructed by stacking a plurality of semiconductor chips 10A each shown in FIG. 1, it is to be noted that the present invention is not limited to such and a stacked semiconductor package may be constructed by stacking a plurality of any of the semiconductor chips 10B, 10C, 10D and 10E shown in FIGS. 2 to 5 instead of the semiconductor chip 10A shown in FIG. 1, or by stacking two or more kinds of semiconductor chips among the semiconductor chips 10A, 10B, 10C, 10D and 10E shown in FIGS. 1 to 5.

Figure 10:
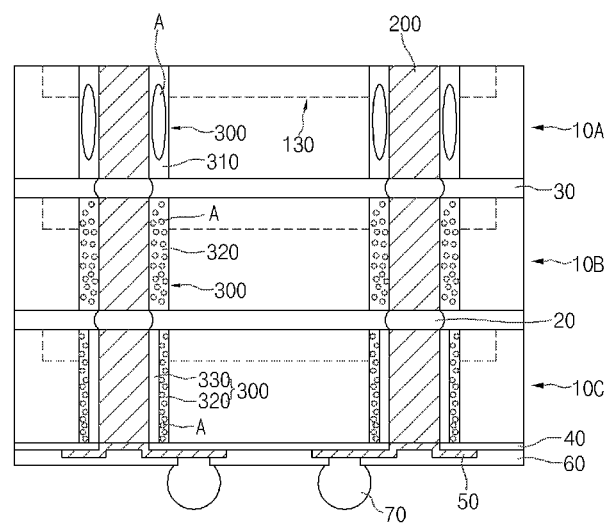
FIG. 10 is a cross-sectional view illustrating a stacked semiconductor package in accordance with a tenth embodiment of the present invention.

FIG. 10 is a cross-sectional view illustrating a stacked semiconductor package in accordance with a tenth embodiment of the present invention.

Unlike the stacked semiconductor packages in accordance with the sixth to ninth embodiments described above with reference to FIGS. 6 to 9, a stacked semiconductor package in accordance with a tenth embodiment of the present invention has a construction in which semiconductor chips stacked upon one another have dielectric layers 300 with different dielectric constant decreasing structures. Hence, the stacked semiconductor package in accordance with the tenth embodiment of the present invention has substantially the same construction as the stacked semiconductor packages in accordance with the sixth to ninth embodiments except that the dielectric layers 300 of each of the semiconductor chips 10A, 10B, 10C has a different dielectric constant decreasing structure. Thus, the same terms and the same reference numerals will be used to refer to the same component parts.

Referring to FIG. 10, in the present embodiment, a stacked semiconductor package includes first to third semiconductor chips 10A, 10B and 10C. Further, the stacked semiconductor package further includes first and second dielectric layers 40 and 60, redistribution lines 50, and external connection terminals 70.

Each of the first to third semiconductor chips 10A, 10B and 10C includes a substrate 100, through-electrodes 200 and a dielectric layer 300 with a dielectric constant decreasing structure.

The second semiconductor chip 10B is stacked on the third semiconductor chip 10C such that the through-electrodes 200 of the third semiconductor chip 10C are connected with the through-electrodes 200 of the second semiconductor chip 10B, and the first semiconductor chip 10A is stacked on the second semiconductor chip 10B such that the through-electrodes 200 of the second semiconductor chip 10B are connected with the through-electrodes 200 of the first semiconductor chip 10A.

The through-electrodes 200 of the first semiconductor chip 10A and the through-electrodes 200 of the second semiconductor chip 10B, and the through-electrodes 200 of the second semiconductor chip 10B and the through-electrodes 200 of the third semiconductor chip 10C are electrically connected with each other by the medium of connection members 20. Adhesive members 30 are formed between the stacked first, second and third semiconductor chips 10A, 10B and 10C to attach upper and lower semiconductor chips 10A, 10B and 10C to each other. The connection members 20 may include solders, and the adhesive members 30 may include non-conductive pastes.

In the present embodiment, the dielectric layer 300 with a dielectric constant decreasing structure of the third semiconductor chip 10C, positioned lowermost, has a highest dielectric constant. The dielectric constants of the dielectric layers 300 with a dielectric constant decreasing structure gradually decrease toward an uppermost semiconductor chip, so that the dielectric layer 300 with a dielectric constant decreasing structure of the first semiconductor chip 10A positioned uppermost has a lowest dielectric constant.

For example, the dielectric layer 300 with a dielectric constant decreasing structure of the third semiconductor chip 10C may have a double-layered structure of a porous dielectric layer 320 which has a plurality of air gaps A therein and an air gap-free dielectric layer 330 which has no air gap therein, the dielectric layer 300 with a dielectric constant decreasing structure of the second semiconductor chip 10B may have a single-layered structure of a porous dielectric layer 320 which has a plurality of air gaps A therein, and the dielectric layer 300 with a dielectric constant decreasing structure of the first semiconductor chip 10A may have a single-layered structure of a hollow type dielectric layer 310 which has an air gap A defined in the center portion thereof.

A first dielectric layer 40 is formed under the lower surface of the third semiconductor chip 10C in such a way as to leave the through-electrodes 200 of the third semiconductor chip 10C exposed. Further, redistribution lines 50, which are electrically connected with the through-electrodes 200 of the third semiconductor chip 10C, are formed under the first dielectric layer 40. A second dielectric layer 60 is formed under the first dielectric layer 40 including the redistribution lines 50 in such a way as to leave portions of the redistribution lines 50 exposed. External connection terminals 70 are mounted to the portions of the redistribution lines 50 which are left exposed through the second dielectric layer 60.

In the present embodiment, as the dielectric constants of the dielectric layers 300 with a dielectric constant decreasing structure gradually decrease from a lowermost semiconductor chip toward an uppermost semiconductor chip, the parasitic capacitance between semiconductor chips 100 and the through-electrodes 200 gradually decreases from the lowermost semiconductor chip toward the uppermost semiconductor chip. As a consequence, a difference in operation speed between upper and lower semiconductor chips decreases, and power noise reduction effect is improved. Further, the various embodiments of dielectric layers 300 with a dielectric constant decreasing structure shown in, for example, FIGS. 1-5, ameliorates the problem with parasitic capacitance between a semiconductor chip and a through-electrode.

The above-described semiconductor chips and stacked semiconductor packages may be applied to various package modules.

Figure 11:
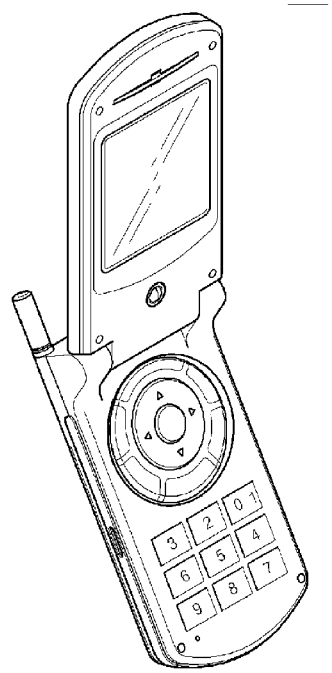
FIG. 11 is a perspective view illustrating an electronic apparatus including a semiconductor chip according to an embodiment the present invention.

FIG. 11 is a perspective view illustrating an electronic apparatus including the semiconductor chip according to the present invention.

Referring to FIG. 11, the semiconductor chip according to embodiments of the present invention may be applied to an electronic apparatus 1000 such as a portable phone. Since the semiconductor chip according to embodiments of the present invention is excellent in terms of reliability, it is advantageous for improving the performance of the electronic apparatus 1000. The electronic apparatus 1000 is not limited to the portable phone shown in FIG. 11, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 12:
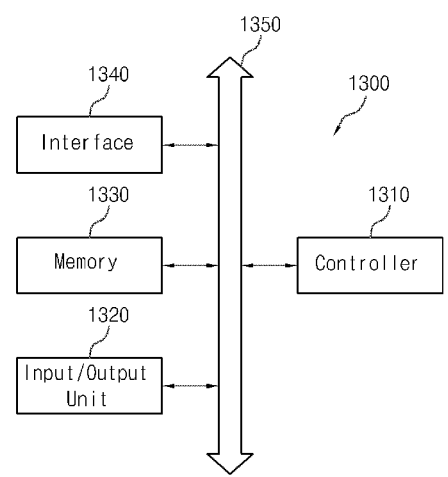
FIG. 12 is a block diagram showing an example of an electronic system including a semiconductor chip according to an embodiment of the present invention.

FIG. 12 is a block diagram showing an example of an electronic system including a semiconductor chip according to the present invention.

Referring to FIG. 12, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data moves. For example, the controller 1310 may include at least any one of at least one microprocessor, at least one digital signal processor, at least one microcontroller, and logic devices capable of performing the same functions as these components. The controller 1310 and the memory 1330 may include a semiconductor chip according to embodiments of the present invention. The input/output unit 1320 may include at least one selected among a keypad, a keyboard, a display device, and so forth. The memory 1330 is a device for storing data. The memory 1330 may store data and/or commands to be executed by the controller 1310, and the like. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desk top computer. The flash memory may be constituted by a semiconductor disc device (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, although not shown, a person skilled in the art will readily appreciate that the electronic system 1300 may be additionally provided with an application chipset, a camera image processor (CIS), an input/output unit, etc.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
   a plurality of semiconductor chips each including a substrate, through-electrodes passing through the substrate and a dielectric layer with a reduced dielectric constant formed between the substrate and the through-electrodes where the dielectric layer with a reduced dielectric constant has at least one air gap, and stacked such that through-electrodes of the plurality of semiconductor chips are connected with one another,
   Wherein the semiconductor chips includes a first semiconductor chip, a second semiconductor chip which is stacked under the first semiconductor chip, and a third semiconductor chip which is stacked under the second semiconductor chip, and
   wherein the dielectric layer with a reduced dielectric constant of the third semiconductor chip has a highest dielectric constant among the semiconductor chips, dielectric constants of dielectric layers with a reduced dielectric constant gradually decrease toward the first semiconductor chip, and the dielectric layer with a reduced dielectric constant of the first semiconductor chip has a lowest dielectric constant,
   Wherein the dielectric layer of the third semiconductor chip comprises a double-layered structure of a porous dielectric layer which has a plurality of air gaps therein and an air gap-free dielectric layer which has no air gap therein, the dielectric layer of the second semiconductor chip comprises a single-layered structure of a porous dielectric layer, and the dielectric layer of the first semiconductor chip comprises a single-layered structure of a hollow type dielectric layer which has an air gap defined in a center portion thereof.

2. The stacked semiconductor package according to claim 1, wherein material comprising the porous dielectric layer includes any one selected from the group consisting of a silicon oxide layer, a silicon nitride layer, a silicon oxynitride layer, HSSQ (hydro silsesquioxane) and MSSQ (methyl silsesquioxane).

3. The stacked semiconductor package according to claim 1, wherein the hollow type dielectric layer includes any one selected from the group consisting of a silicon oxide layer, a silicon nitride layer, a silicon oxynitride layer, polyimide, BCB and parylene.

4. The stacked semiconductor package according to claim 1, wherein the air gap-free dielectric layer includes any one selected from the group consisting of a silicon oxide layer, a silicon nitride layer, a silicon oxynitride layer, polyimide, BCB and parylene.

5. The stacked semiconductor package according to claim 1, further comprising:
   a first dielectric layer formed under the third semiconductor chip in such a way as to leave the through-electrodes of the third semiconductor chip exposed;
   redistribution lines formed under the first dielectric layer and electrically connected with the exposed through-electrodes of the third semiconductor chip; and
   a second dielectric layer formed under the first dielectric layer including the redistribution lines in such a way as to leave portions of the redistribution lines exposed.

6. The stacked semiconductor package according to claim 5, further comprising:
   external connection terminals mounted to the portions of the redistribution lines which are exposed through the second dielectric layer.

7. The stacked semiconductor package according to claim 1, further comprising:
   a structural body supporting the semiconductor chips and having connection electrodes which are electrically connected with the through-electrodes of the third semiconductor chip.

8. The stacked semiconductor package according to claim 7, wherein the structural body comprises a printed circuit board.

9. The stacked semiconductor package according to claim 7, wherein the structural body comprises any one of an interposer and a semiconductor package.

* * * * *